(12) United States Patent
Makiyama et al.

(10) Patent No.: US 8,816,408 B2
(45) Date of Patent: Aug. 26, 2014

(54) COMPOUND SEMICONDUCTOR DEVICE AND MANUFACTURING METHOD THEREOF

(75) Inventors: Kozo Makiyama, Kawasaki (JP); Toshihide Kikkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 838 days.

(21) Appl. No.: 12/721,052

(22) Filed: Mar. 10, 2010

(65) Prior Publication Data
US 2010/0244104 A1 Sep. 30, 2010

(30) Foreign Application Priority Data

Mar. 31, 2009 (JP) .................................. 2009-86492

(51) Int. Cl.
| | | |
|---|---|---|
| *H01L 29/66* | (2006.01) | |
| *H01L 29/778* | (2006.01) | |
| *H01L 29/78* | (2006.01) | |
| *H01L 29/20* | (2006.01) | |
| *H01L 29/06* | (2006.01) | |
| *H01L 29/423* | (2006.01) | |

(52) U.S. Cl.
CPC ......... *H01L 29/7787* (2013.01); *H01L 29/2003* (2013.01); *H01L 29/0692* (2013.01); *H01L 29/66462* (2013.01); *H01L 29/7843* (2013.01); *H01L 29/42316* (2013.01); *H01L 29/42376* (2013.01)
USPC .............. 257/280; 257/281; 257/E29.317; 257/E21.445; 438/167; 438/186

(58) Field of Classification Search
USPC ............... 257/155, 279, 280, 281, E31.074, 257/E29.317, E21.445; 438/167, 186
See application file for complete search history.

(56) References Cited

U.S. PATENT DOCUMENTS

| | | | | |
|---|---|---|---|---|
| 5,500,381 | A | * | 3/1996 | Yoshida et al. ............... 438/172 |
| 8,330,187 | B2 | * | 12/2012 | Takehiko et al. ............. 257/192 |
| 2005/0127439 | A1 | * | 6/2005 | Matsuzaki et al. ............. 257/341 |
| 2007/0264762 | A1 | * | 11/2007 | Yeo et al. ........................ 438/157 |
| 2008/0203541 | A1 | | 8/2008 | Makiyama |

FOREIGN PATENT DOCUMENTS

| | | |
|---|---|---|
| JP | 2007-173426 A | 7/2007 |
| JP | 2008-205392 A | 9/2008 |
| JP | 2009-26838 A | 2/2009 |

OTHER PUBLICATIONS

Japanese Office Action dated Apr. 30, 2013, issued in corresponding Japanese Patent Application No. 2009-086492, w/ English translation.
Japanese Office Action dated Oct. 1, 2013, issued in Japanese Patent Application No. 2009-086492, w/English translation.

* cited by examiner

*Primary Examiner* — Colleen Matthews
*Assistant Examiner* — Colleen E Snow
(74) *Attorney, Agent, or Firm* — Westerman, Hattori, Daniels & Adrian, LLP

(57) ABSTRACT

A compound semiconductor device includes a compound semiconductor laminated structure; a source electrode, a drain electrode, and a gate electrode formed over the compound semiconductor laminated structure; a first protective film formed over the compound semiconductor laminated structure between the source electrode and the gate electrode and including silicon; and a second protective film formed over the compound semiconductor laminated structure between the drain electrode and the gate electrode and including more silicon than the first protective film.

18 Claims, 10 Drawing Sheets

COMPOUND SEMICONDUCTOR DEVICE AND MANUFACTURING METHOD THEREOF

CROSS-REFERENCE TO RELATED APPLICATIONS

This application is based upon and claims the benefit of priority of the prior Japanese Patent Application No. 2009-086492, filed on Mar. 31, 2009, the entire contents of which are incorporated herein by reference.

FIELD

The present invention relates to a compound semiconductor device and a manufacturing method thereof.

BACKGROUND

In recent years, the applicability of compound semiconductor devices, particularly high electron mobility transistors (HEMT) using a GaN based compound semiconductor as a main material to high-output high-frequency devices has been examined. A HEMT using a GaN compound semiconductor as a main material (hereinafter, referred to as a GaN type HEMT) includes a silicon nitride film formed over the surface thereof by, for example, the plasma chemical vapor deposition (CVD) for the stabilization of electric characteristics and chemical characteristics. Many traps that cause fluctuations in current called current collapses are present on the surface of GaN type HEMT and a silicon nitride film is effective in inactivating such traps.

However, it is difficult to obtain a high drain current from a conventional GaN type HEMT including the above structure.

Japanese Laid-open Patent Publication No. 2008-205392 is known as a related technology.

SUMMARY

According to an aspect of the invention, a compound semiconductor device includes a compound semiconductor laminated structure; a source electrode, a drain electrode, and a gate electrode formed over the compound semiconductor laminated structure; a first protective film formed over the compound semiconductor laminated structure between the source electrode and the gate electrode and including silicon; and a second protective film formed over the compound semiconductor laminated structure between the drain electrode and the gate electrode and including more silicon than the first protective film.

According to another aspect of the invention, a manufacturing method of a compound semiconductor device, including forming a source electrode, a drain electrode, and a gate electrode over a compound semiconductor laminated structure; forming a first protective film including silicon over the compound semiconductor laminated structure between the source electrode and the gate electrode; and forming a second protective film including more silicon than the first protective film over the compound semiconductor laminated structure between the drain electrode and the gate electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The inventors of the present invention investigated why a high drain current cannot be obtained from a conventional GaN type HEMT. As a result, the inventors found that sheet resistance between the source and gate increases with an increasing amount of silicon (Si) in a silicon nitride film formed to suppress fluctuations in current. On the other hand, the inventors also found that current collapse is suppressed with an increasing amount of Si in the silicon nitride film. That is, the investigation revealed that if suppression of current collapse is attempted, the sheet resistance increases, which leads to a lower drain current, and if an increase of the drain current is attempted, current collapse is more likely to occur. Further, investigation by the inventors of the present invention indicated that if the amount of Si in a silicon nitride film positioned between the source and gate is smaller than that of Si in a silicon nitride film positioned between the drain and gate, characteristics in conventional tradeoffs between suppression of current collapse and improvement of drain current may coexist.

[First Embodiment]

Figure 1A:
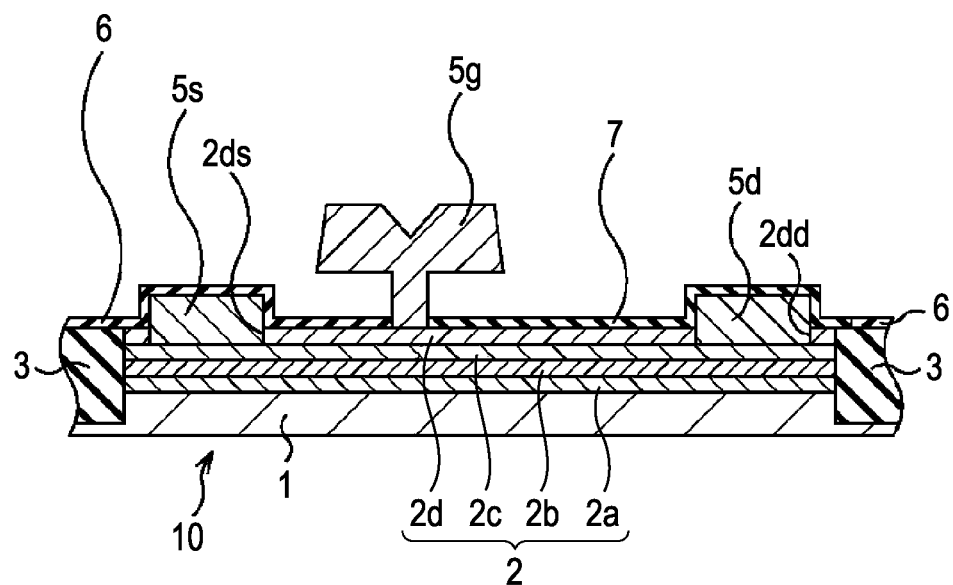
FIG. 1A is a sectional view illustrating a structure of a GaN type HEMT in a first embodiment.
Figure 1B:
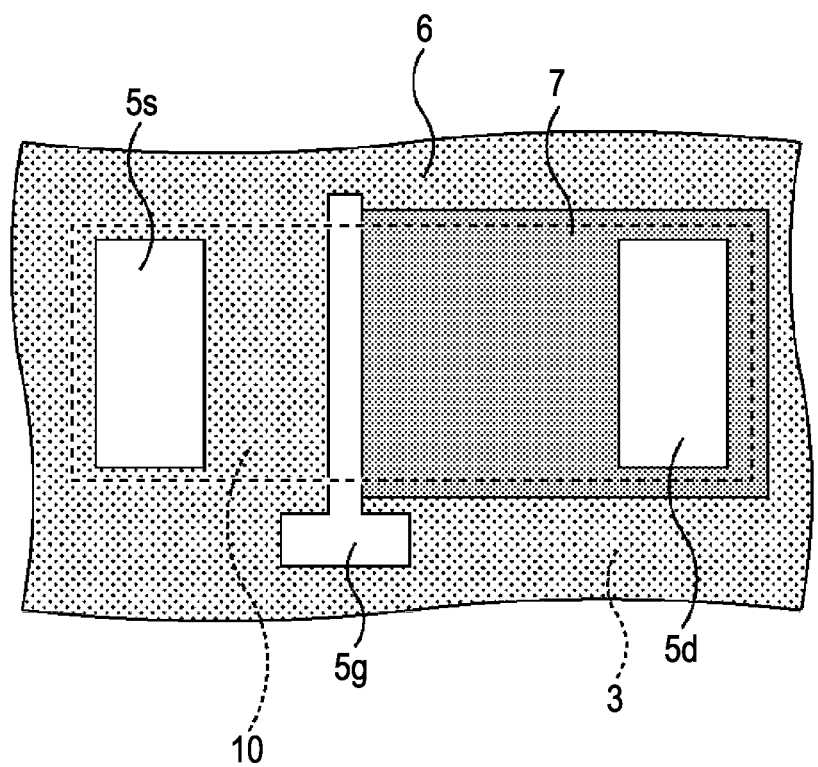
FIG. 1B is a diagram illustrating a layout of the GaN type HEMT in the first embodiment.

First, the first embodiment will be described. FIG. 1A is a sectional view illustrating a structure of the GaN type HEMT (semiconductor device) in the first embodiment. FIG. 1B is a diagram illustrating a layout of the GaN type HEMT (semiconductor device) in the first embodiment.

In the first embodiment, as illustrated in FIG. 1A, for example, a compound semiconductor region 2 (compound semiconductor laminated structure) is formed over a substrate 1 such as a semi-insulating SiC substrate. The compound semiconductor region 2 includes, for example, a buffer layer 2a, an electron transit layer 2b, an electron supply layer 2c, and a surface layer 2d. The buffer layer 2a and the electron transit layer 2b are, for example, a GaN layer (i-GaN layer) where no impurity is doped and the total thickness thereof is about 3 μm. The buffer layer 2a prevents propagation of lattice defects present on the surface of the substrate 1 into the electron transit layer 2b. The electron supply layer 2c is, for example, an n-type AlGaN layer (n-AlGaN layer) and the thickness thereof is about 10 nm. The surface layer 2d is, for example, an n-type GaN layer (n-GaN layer) and the thickness thereof is about 10 nm or less.

A device isolation region 3 that demarcates an active region 10 is formed around the compound semiconductor region 2. Openings 2ds and 2dd are formed in the surface layer 2d to expose the electron supply layer 2c. An ohmic electrode is formed in the opening 2ds as a source electrode 5s and an ohmic electrode is formed in the opening 2dd as a drain electrode 5d.

As illustrated in FIGS. 1A and 1B, a gate electrode 5g in, for example, a mushroom shape is formed in a region between the source electrode 5s and the drain electrode 5d over the electron supply layer 2c. The gate electrode 5g is positioned, for example, closer to the source electrode 5s than the drain electrode 5d. Then, for example, a silicon nitride film 6 (first protective film) is formed over the surface layer 2d between the gate electrode 5g and the source electrode 5s, and a silicon nitride film 7 (second protective film) is formed over the surface layer 2d between the gate electrode 5g and the drain electrode 5d. As illustrated in FIG. 1B, for example, the silicon nitride film 7 covers the active region 10 on the drain electrode 5d side of the gate electrode 5g and slightly overlaps the active region 10. The silicon nitride film 6 covers the active region 10 on the source electrode 5s side of the gate electrode 5g and also surrounds the silicon nitride film 7. The silicon nitride film 7 contains more Si than the silicon nitride film 6. For example, the ratio of Si contained in the silicon nitride film 6 is equal to or lower than the ratio of Si in the stoichiometry ($Si_3N_4$), and the ratio of Si contained in the silicon nitride film 7 is higher than the ratio of Si in the stoichiometry ($Si_3N_4$). The amount of Si—H bond groups in the silicon nitride film 6 is less than $1.1 \times 10^{22}/cm^3$ and the amount of Si—H bond groups in the silicon nitride film 7 is equal to or more than $1.1 \times 10^{22}/cm^3$. The refractive index of the silicon nitride film 6 is 1.8 to 2.0 (for example, about 2.0) and the refractive index of the silicon nitride film 7 is 2.0 to 2.3 (for example, about 2.3). The refractive index of a silicon nitride film reflects the content of Si, and a silicon nitride film having a higher refractive index contains more Si. The thicknesses of the silicon nitride films 6 and 7 are 10 nm to 50 nm (for example, about 20 nm).

In the first embodiment described above, the silicon nitride films 6 and 7 also contain hydrogen (H), and H contained therein and Si bond. The Si—H bond acts on an unstable bond present over the surface of the compound semiconductor region 2, for example the Ga—O bond, to reduce unstable bonds, indicating the possibility of the stabilization of the bond state. As a result, current collapse may be suppressed. On the other hand, H in the Si—H bond is capable of inactivating donors by penetrating into the compound semiconductor region 2. Inactivation of donors decreases concentrations of two-dimensional electron gas, leading to higher sheet resistance.

Comparison of sheet resistance between the gate electrode 5g and the source electrode 5s to the sheet resistance between the gate electrode 5g and the drain electrode 5d indicates that the former is more likely to affect the magnitude of drain current. Further, comparison of the surface and silicon nitride film in the compound semiconductor region 2 between the gate electrode 5g and the source electrode 5s and the surface and silicon nitride film in the compound semiconductor region 2 between the gate electrode 5g and the drain electrode 5d indicates that the latter is more likely to affect the current collapse.

In the first embodiment, the amount of Si in the silicon nitride film 6 positioned between the gate electrode 5g and the source electrode 5s is smaller than that of Si in the silicon nitride film 7 positioned between the gate electrode 5g and the drain electrode 5d. That is, the amount of Si—H bonds is relatively small between the gate electrode 5g and the source electrode 5s, and the amount of Si—H bonds is relatively large between the gate electrode 5g and the drain electrode 5d. Thus, sheet resistance is lower between the gate electrode 5g and the source electrode 5s, and the current collapse is suppressed between the gate electrode 5g and the drain electrode 5d. Therefore, a high drain current may be obtained by decreasing sheet resistance while suppressing the current collapse in the GaN type HEMT as a whole.

The verification based on a experimentation performed by the inventors indicated that sheet resistance is decreased to about 300 $\Omega/cm^2$ by adopting the structure in the first embodiment while sheet resistance on the source electrode 5s side is about 350 $\Omega/cm^2$ when a structure in which the silicon nitride film 7 covers the surface without using the silicon nitride film 6 is adopted.

As described above, the gate electrode 5g is positioned closer to the source electrode 5s than the drain electrode 5d in the first embodiment and thus, an effect of an offset gate structure may be achieved. That is, a parasitic capacitance between gate and drain may be decreased to improve gate-drain breakdown voltage. Moreover, source resistance may be decreased. Therefore, the structure in the first embodiment is particularly useful for a compound semiconductor device that desires high output power.

Refractive indexes of the silicon nitride films 6 and 7 may be measured by, for example, the spectroscopic ellipsometry method or single wavelength ellipsometry method. When the spectroscopic ellipsometry method is used, 633 nm may be substituted into a refractive index function to adopt the refractive index at this wavelength. When the single wavelength ellipsometry method is used, on the other hand, measurement is made using, for example, a He—Ne laser (wavelength: 632.8 nm) as a light source to determine the refractive index.

It is preferable that the silicon nitride film 6 apply a tensile stress to the compound semiconductor region 2 thereunder and the silicon nitride film 7 apply a compressive stress to the compound semiconductor region 2 thereunder. This is intended to effectively decrease sheet resistance and to effectively suppress the current collapse. If stresses in the opposite direction act over the compound semiconductor region 2 in this manner, the stresses cancel each other out and a force acting over the whole GaN type HEMT is alleviated. As a result, deterioration in wafer smoothness accompanying stress, breaking of resist films and the like may be suppressed. The silicon nitride film 6 may apply a compressive stress, but in this case, the compressive stress is preferably smaller than the compressive stress of the silicon nitride film 7.

Figure 2A:
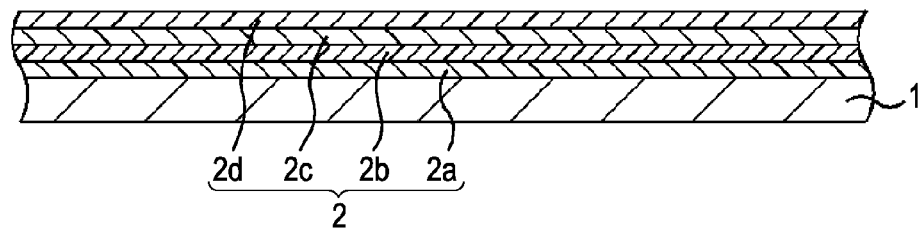
FIGS. 2A to 2P are sectional views illustrating a method of manufacturing the GaN type HEMT in the first embodiment.

Next, the method of manufacturing a GaN type HEMT in the first embodiment will be described. FIGS. 2A to 2P are sectional views illustrating the method of manufacturing the GaN type HEMT in the first embodiment.

First, as illustrated in FIG. 2A, the buffer layer 2a, the electron transit layer 2b, the electron supply layer 2c, and the surface layer 2d are formed over the substrate 1 by, for example, the metal organic vapor phase epitaxy (MOVPE) method. For example, the buffer layer 2a, the electron transit layer 2b, the electron supply layer 2c, and the surface layer 2d are included in the compound semiconductor region 2.

Figure 2B:
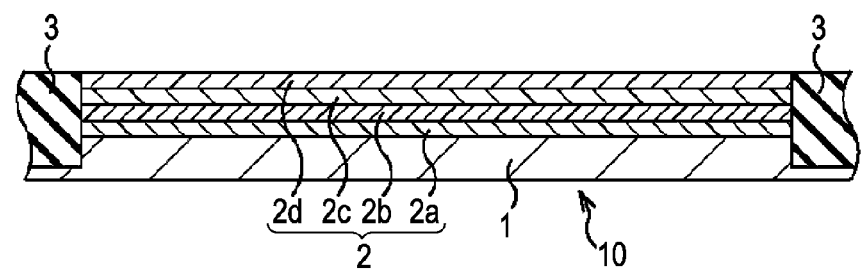

As illustrated in FIG. 2B, by injecting Ar selectively into the compound semiconductor region 2, the device isolation region 3 demarcating the active region 10 is formed in the compound semiconductor region 2 and partially into the surface layer of the substrate 1.

Figure 2C:
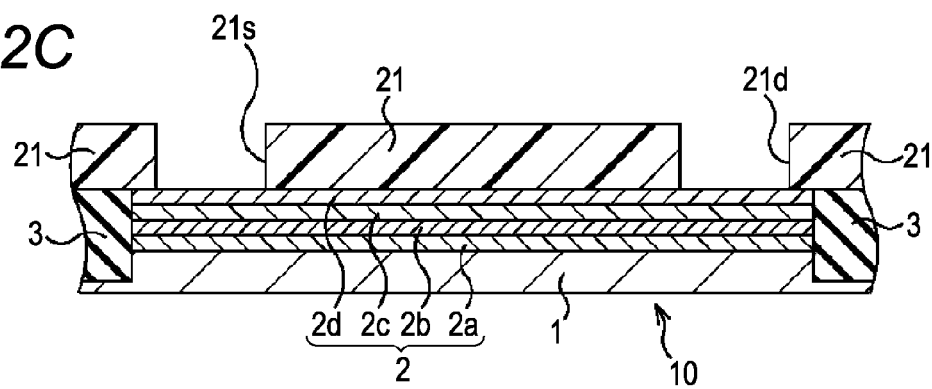

Then, as illustrated in FIG. 2C, a resist pattern 21, in which an opening 21s is provided in a region where the source electrode 5s will be formed and an opening 21d is provided in a region where the drain electrode 5d will be formed, is formed over the compound semiconductor region 2.

Figure 2D:
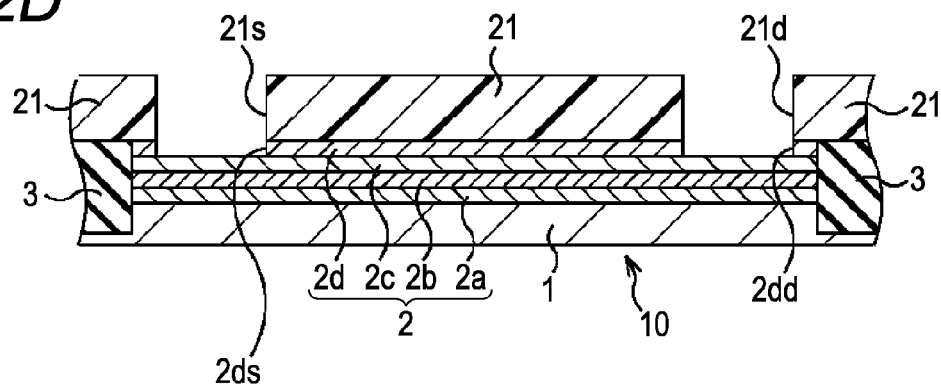

Then, as illustrated in FIG. 2D, openings 2ds and 2dd are formed in the surface layer 2d by using the resist pattern 21 as a mask and performing dry etching using an inert gas and a chlorine based gas such as a $Cl_2$ gas over the surface layer 2d. Regarding the depth of the openings 2ds and 2dd, a portion of the surface layer 2d may be left behind or a portion of the electron supply layer 2c may be removed. That is, there is no need for the depth of the openings 2ds and 2dd to match the thickness of the surface layer 2d.

Figure 2E:
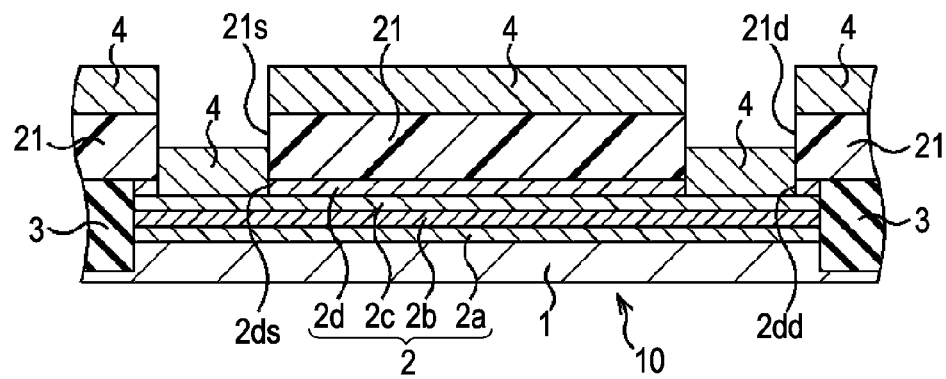

Then, as illustrated in FIG. 2E, for example, a metallic film 4 is formed. For the formation of the metallic film 4, for example, a Ti film is first formed by the evaporation method and an Al film is formed thereon by the evaporation method. The thickness of the Ti layer is about 20 nm and that of the Al film is about 200 nm.

Figure 2F:
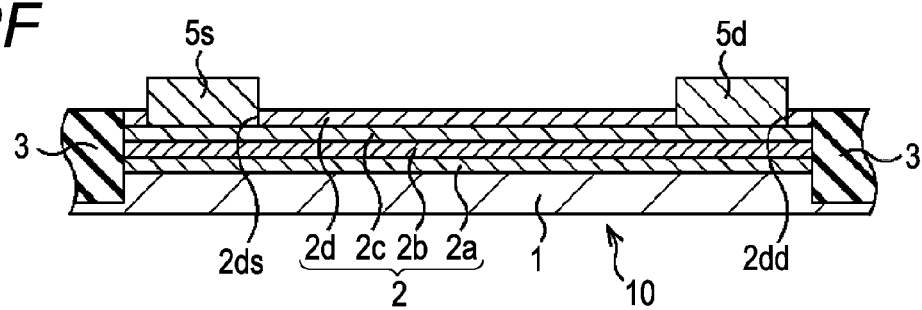

Then, as illustrated in FIG. 2F, the resist pattern 21 is removed together with the metallic film 4 thereon. As a result, the source electrode 5s is obtained from the metallic film 4 formed inside the opening 21s and the drain electrode 5d is obtained from the metallic film 4 formed inside the opening 21d. Thus, for example, technologies of vapor deposition and liftoff are used for the formation of the source electrode 5s and the drain electrode 5d. Then, the electron supply layer 2c, and the source electrode 5s and the drain electrode 5d are ohmically brought into contact by heat treatment at about 550° C.

Figure 2G:
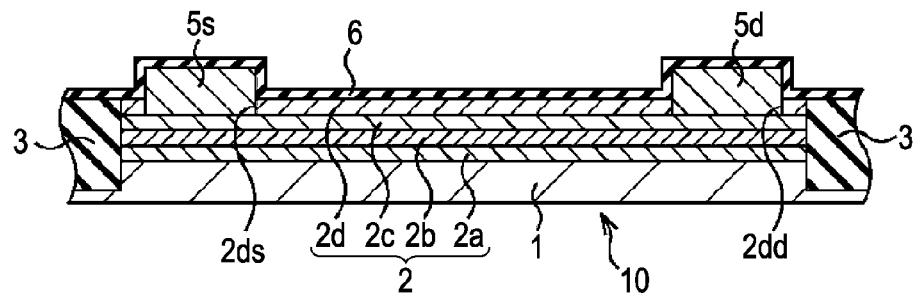

Then, as illustrated in FIG. 2G, the silicon nitride film 6, which covers the source electrode 5s and the drain electrode 5d, is formed over the compound semiconductor region 2 by, for example, the plasma CVD method. For example, conditions for the formation are: plasma excitation frequency: 13.56 MHz; high-frequency output: 50 W; and gas flow rate: $SiH_4/N_2/He=2$ sccm/150 sccm/1000 sccm. As a result, the silicon nitride film 6 whose refractive index is about 2.0 is obtained. The thickness of the silicon nitride film 6 is, for example, about 20 nm.

Figure 2H:
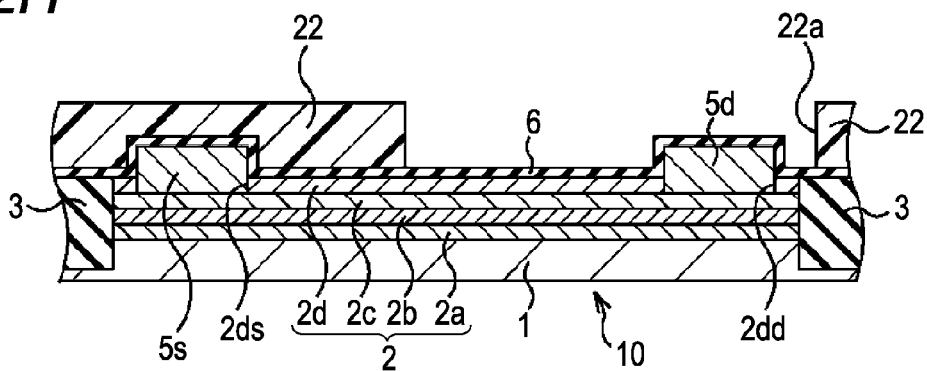

Then, as illustrated in FIG. 2H, a resist pattern 22 provided with an opening 22a in a region where the silicon nitride film 7 will be formed is formed over the silicon nitride film 6. In the formation of the resist pattern 22, for example, polymethylmethacrylate (PMMA) (for example, manufactured by US MicroChem. Corp.) is applied by, for example, the spin coat method, and heat treatment is performed to form a resist film. Then, the opening 22a is formed in the resist film by the electron beam lithography method. With the above processing, a resist opening as illustrated in FIG. 2H is obtained.

Figure 2I:
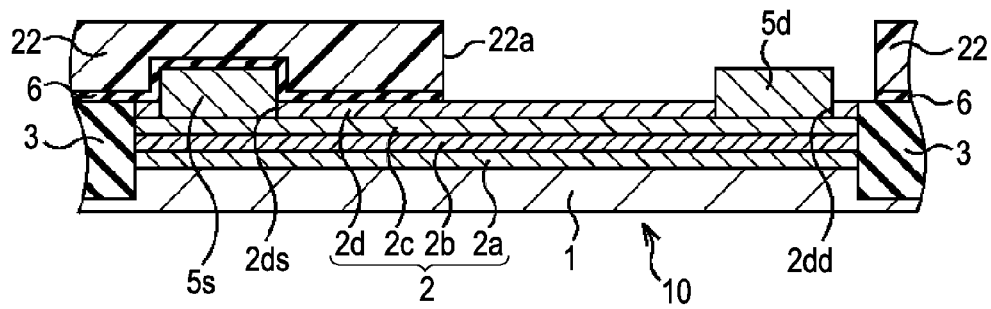

Then, as illustrated in FIG. 2I, the silicon nitride film 6 is selectively removed by using the resist pattern 22 as a mask and performing wet etching using, for example, a buffered fluoric acid (HF) solution.

Figure 2J:
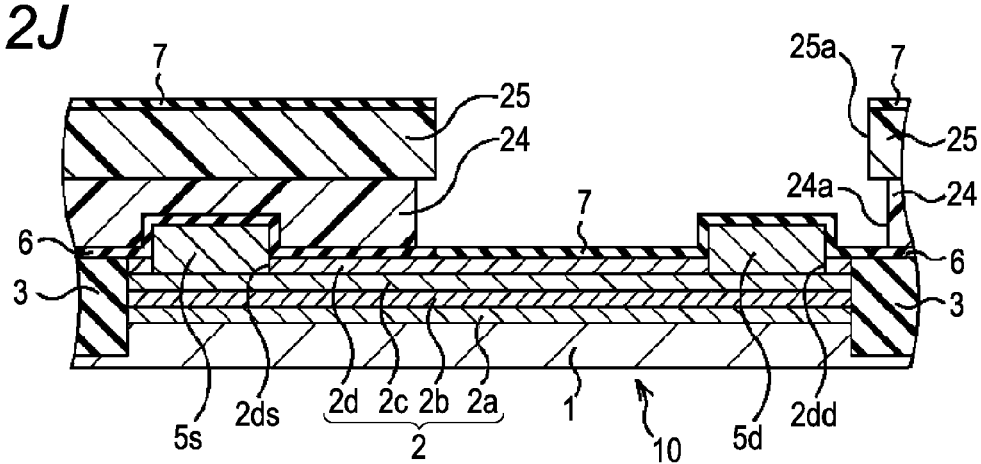

Then, the resist pattern 22 is removed. Then, as illustrated in FIG. 2J, a lower-layer resist pattern 24 provided with an opening 24a in a region where the silicon nitride film 7 will be formed and at edges of the silicon nitride film 6 and a higher-layer resist pattern 25 positioned thereon and provided with an opening 25a smaller than the opening 24a are formed over the silicon nitride film 6. In the formation of the lower-layer resist pattern 24 and the higher-layer resist pattern 25, for example, polymethyl glutarimide (PMGI) (for example, manufactured by US MicroChem. Corp.) is first applied by, for example, the spin coat method and heat treatment is performed to form a resist film. Then, for example, a positive electron beam resist (for example, trade name ZEP520-A: manufactured by Zeon Corporation) is applied by, for example, the spin coat method, and heat treatment is performed to form a resist film. Then, the opening 25a is formed in an upper-layer resist film by the electron beam lithography method. As a result, the higher-layer resist pattern 25 provided with the opening 25a is obtained. Next, wet etching of the lower-layer resist film is performed using, for example, an alkali developer while using the higher-layer resist pattern 25 as a mask. As a result, the lower-layer resist pattern 24 provided with the opening 24a is obtained. With the above processing, a multi-layer resist opening in an eave structure is obtained.

Then, as illustrated similarly in FIG. 2J, the silicon nitride film 7 covering the drain electrode 5d is formed in the opening of the silicon nitride film 6 by the plasma CVD method. For example, conditions for the formation are: plasma excitation frequency: 13.56 MHz; high-frequency output: 50 W; gas flow rate: $SiH_4/N_2/He=3$ sccm/150 sccm/1000 sccm; and film formation temperature: 200° C. As a result, the silicon nitride film 7 whose refractive index is about 2.3 is obtained. The thickness of the silicon nitride film 7 is, for example, about 20 nm. The film formation temperature is a temperature that does not exceed resist heat tolerance.

Figure 2K:
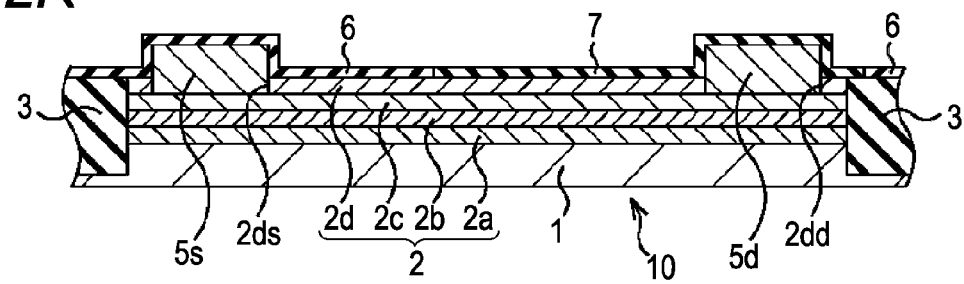

Then, as illustrated in FIG. 2K, the lower-layer resist pattern 24 and the upper-layer resist pattern 25 are removed together with the silicon nitride film 7 thereon. For the removal, for example, a heated stripping solvent is used. After the stripping solvent is infiltrated, for example, ultrasonic cleaning using an organic solvent is performed to completely remove fragments of the silicon nitride film.

Figure 2L:
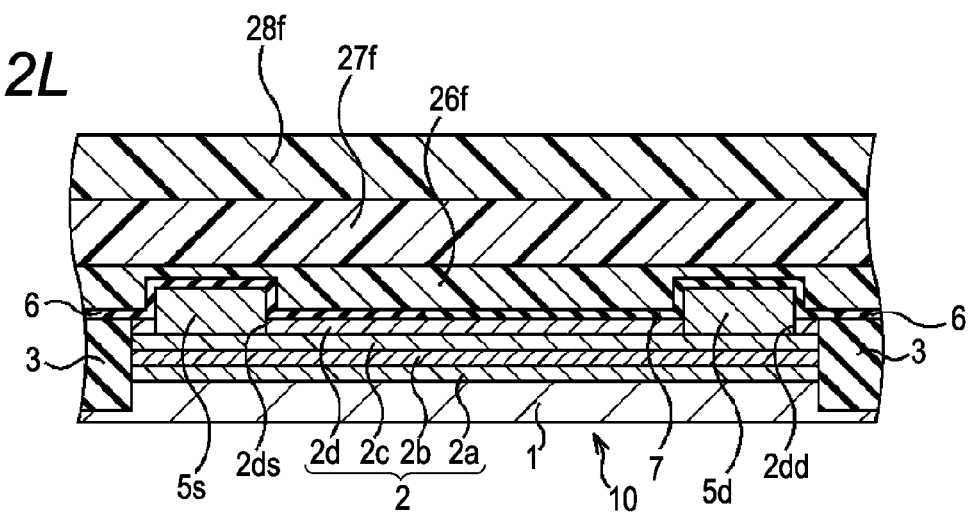

Then, as illustrated in FIG. 2L, a fine gate resist film 26f, a lower-layer resist film 27f, and an upper-layer resist film 28f are formed over the silicon nitride films 6 and 7. In the formation of the fine gate resist film 26f, for example, polymethylmethacrylate resin (PMMA) (for example, manufactured by US MicroChem. Corp.) is applied by, for example, the spin coat method, and heat treatment is performed. In the formation of the lower-layer resist film 27f, for example, PMGI is applied by the spin coat method, and heat treatment is performed. In the formation of the upper-layer resist film 28f, for example, a positive electron beam resist (for example, trade name ZEP520-A: manufactured by Zeon Corporation) is applied by, for example, the spin coat method, and heat treatment is performed.

Figure 2M:
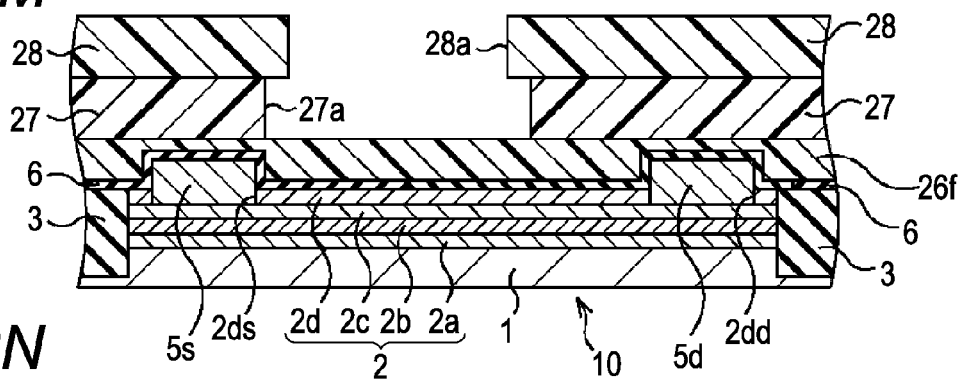

Then, as illustrated in FIG. 2M, a pattern whose width is about 0.8 μm is drawn over the upper-layer resist film 28f by the electron beam lithography method. Then, an upper-layer resist pattern 28 is obtained by development of the upper-layer resist film 28f using a mixed solution of, for example, methyl ethyl ketone (MEK) and meso-isobutyl ketone (MIBK) to form an opening 28a. Further, a lower-layer resist pattern 27 is obtained using the upper-layer resist pattern 28 as a mask and performing wet etching of the lower-layer resist film 27f using, for example, tetramethyl ammonium hydroxide (TMAH) to form an opening 27a. The opening 27a is larger than the opening 28a and the difference of the opening 27a and the opening 28a is, for example, about 0.2 μm. With the above processing, as illustrated in FIG. 2M, a multi-layer resist in an eave structure is obtained.

Figure 2N:
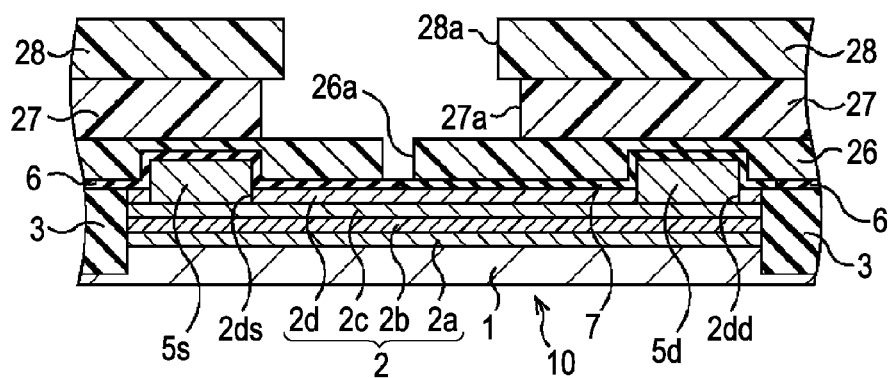

Then, as illustrated in FIG. 2N, a pattern whose width is about 0.1 μm is drawn in the fine gate resist film 26f by the electron beam lithography method. Then, a fine gate resist pattern 26 is obtained by development of the fine gate resist film 26f using a mixed solution of, for example, meso-isobutyl ketone (MIBK) and isopropyl alcohol (IPA) to form an opening 26a. The position where the opening 26a is formed is, for example, the boundary between the silicon nitride films 6 and 7. That is, edges of the silicon nitride films 6 and 7 are exposed by the opening 26a.

Figure 2O:
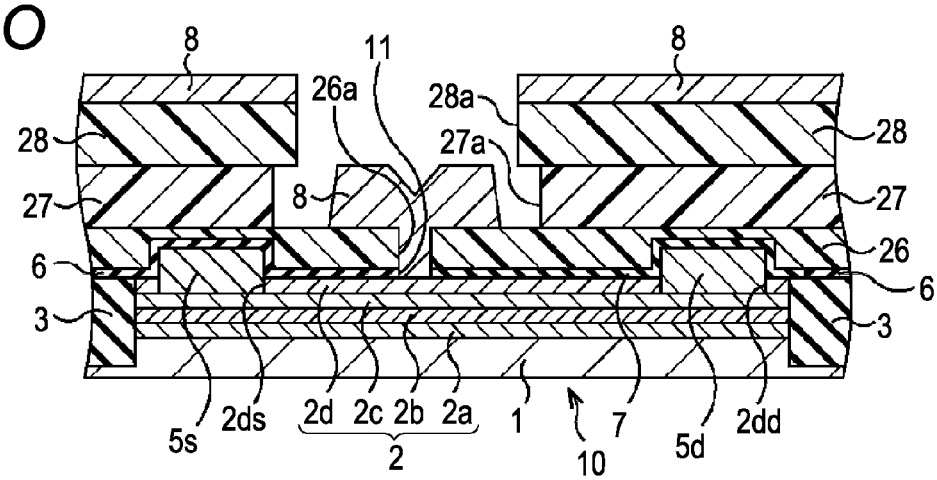
Figure 2P:
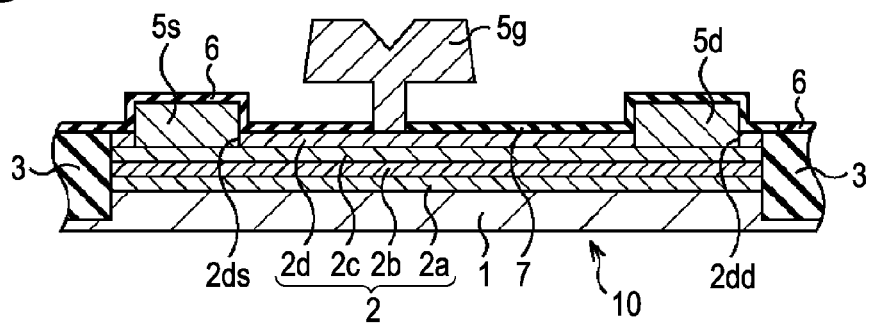

Then, as illustrated in FIG. 2O, an opening 11 is formed by performing etching of a portion of the silicon nitride films 6 and 7 exposed by the opening 26a. For the dry etching, for example, an $SF_6$ gas is used for the dry etching.

Then, as illustrated similarly in FIG. 2O, a metallic film 8 is formed. In the formation of the metallic film 8, for example, an Ni layer is first formed by the evaporation method and then, an Au layer is formed thereon by the evaporation method. The thickness of the Ni layer is about 10 nm and that of the Au film is about 300 nm.

Then, as illustrated in FIG. 2P, the resist patterns 26 to 28 are removed together with the metallic film 8 thereon. As a result, the gate electrode 5g is obtained from the metallic film 8 formed inside the openings 26a to 28a. Thus, for example, technologies of vapor deposition and liftoff are also used for the formation of the gate electrode 5g.

Figure 3A:
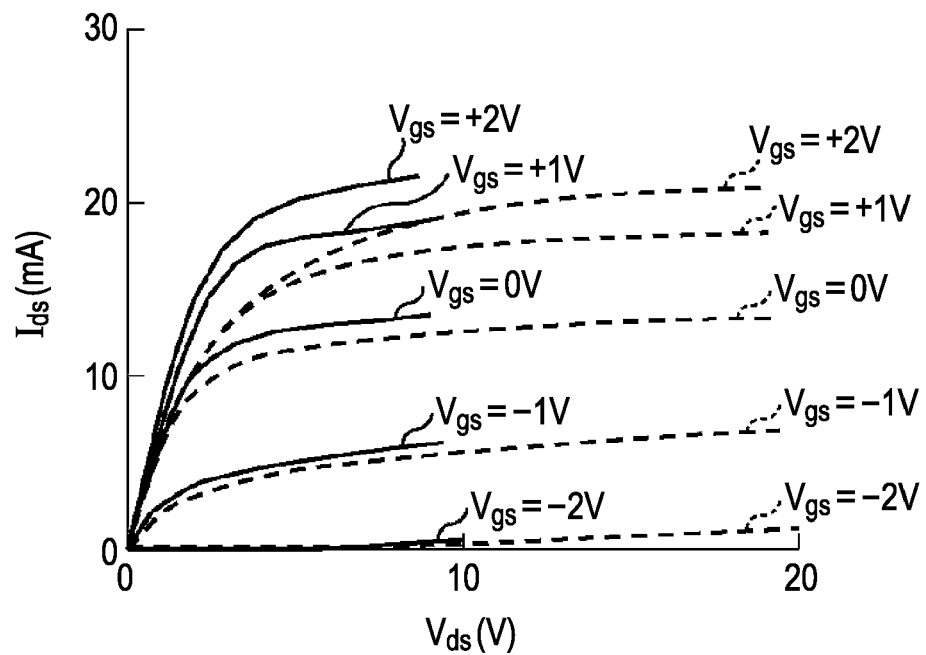
FIGS. 3A and 3B are graphs illustrating experimentation results concerning the first embodiment.
Figure 3B:
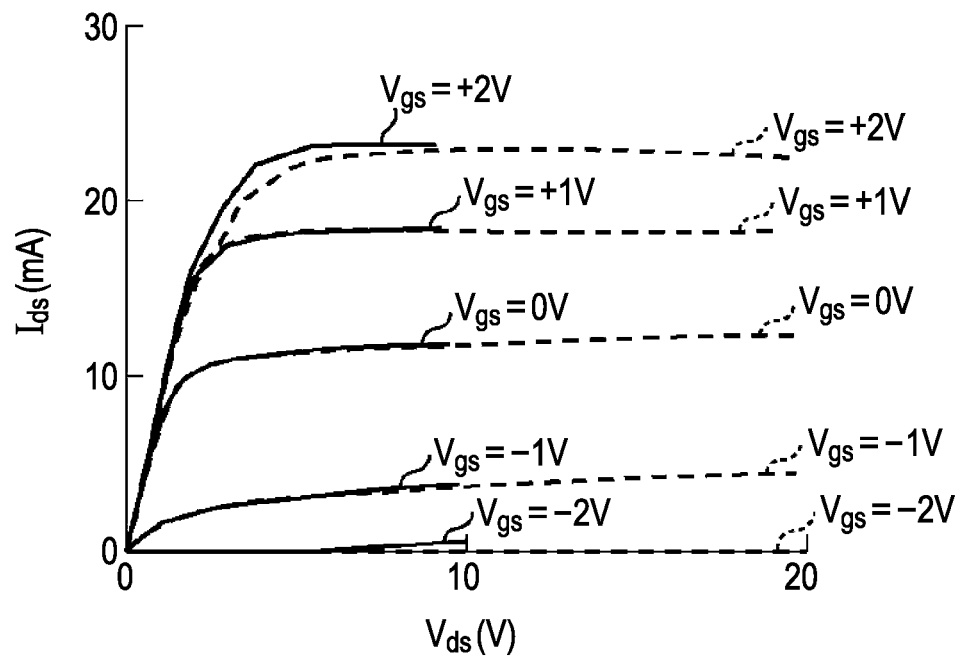

Then, a protective film covering the gate electrode 5g and wires are formed to complete the GaN type HEMT (semiconductor device). FIGS. 3A and 3B illustrate results of experimentations of current-voltage characteristics performed by the inventors. FIG. 3A illustrates a result when a surface protective film is formed only from a low refractive index silicon nitride film that may prevent damage to the device, and FIG. 3B illustrates a result when, like the first embodiment, a high refractive index silicon nitride film is also formed. When only a low refractive index silicon nitride film was used, as illustrated in FIG. 3A, a phenomenon of decreasing Ids, that is, current collapse, appeared conspicuously when Vds was increased up to 20 V. In contrast, when a high refractive index silicon nitride film was arranged between the gate electrode and drain electrode, as illustrated in FIG. 3B, the current collapse was significantly reduced. As an additional effect, manufacturing problems such as resist opening cracks also disappeared thanks to a stress relaxation effect of the whole semiconductor substrate.

When the silicon nitride film 7 is formed, the resist pattern 22 used for the formation of the silicon nitride film 6 may be used as is. That is, the silicon nitride film 7 may be formed while the resist pattern 22 is left over the silicon nitride film 6. In this case, the lower-layer resist pattern 24 and the upper-layer resist pattern 25 become unnecessary so that the number of processes, time, and costs may be reduced.

[Second Embodiment]

Next, the second embodiment will be described. FIGS. 4A to 4E are sectional views illustrating the method of manufacturing the GaN type HEMT in the second embodiment.

Figure 4A:
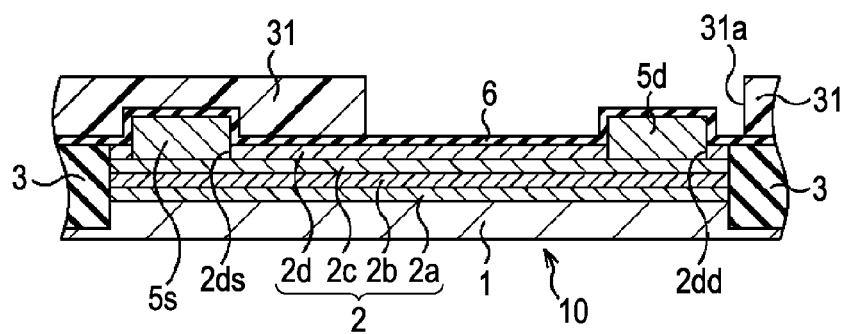
FIGS. 4A to 4E are sectional views illustrating the method of manufacturing the GaN type HEMT in a second embodiment.

First, processing up to the formation of the silicon nitride film 6 is performed in the similar manner as the first embodiment (FIG. 2G). Then, as illustrated in FIG. 4A, a resist pattern 31 provided with an opening 31a in a region where the silicon nitride film 7 will be formed is formed over the silicon nitride film 6. In the formation of the resist pattern 31, for example, a positive electron beam resist (for example, polymethylmethacrylate (PMMA) manufactured by US Micro-Chem. Corp.) is applied by, for example, the spin coat method, and heat treatment is performed to form a resist film. Then, an opening 31a is formed in the resist film by the electron beam lithography method. As a result, the resist pattern 31 provided with the opening 31a is obtained.

Figure 4B:
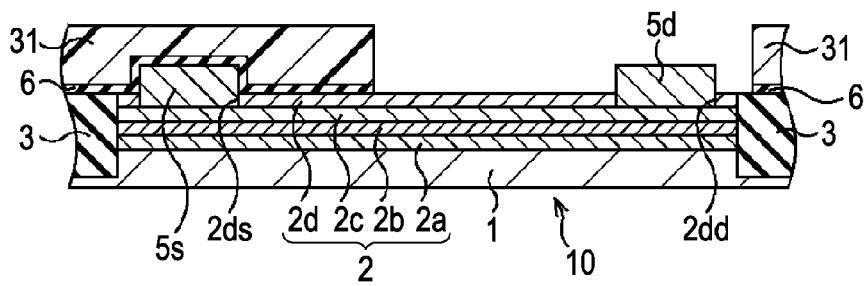

Then, as illustrated in FIG. 4B, the silicon nitride film 6 is selectively removed by using the resist pattern 31 as a mask and performing wet etching using, for example, a buffered fluoric acid (HF) solution.

Figure 4C:
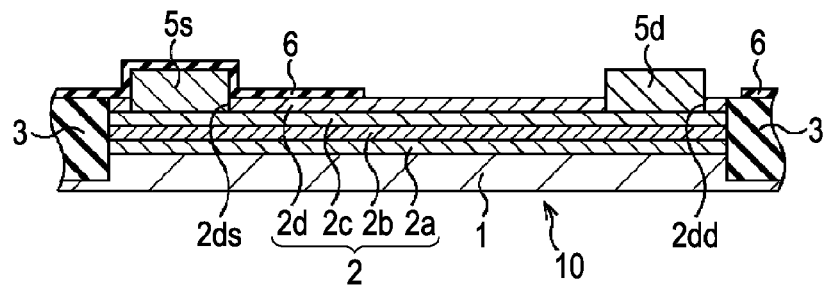

Then, as illustrated in FIG. 4C, the resist pattern 31 is removed.

Figure 4D:
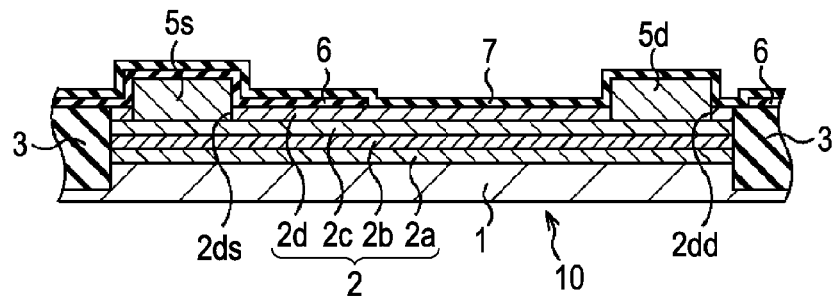

Then, as illustrated in FIG. 4D, the silicon nitride film 7 covering the drain electrode 5d and the silicon nitride film 6 is formed over the compound semiconductor region 2 by, for example, the plasma CVD method.

Figure 4E:
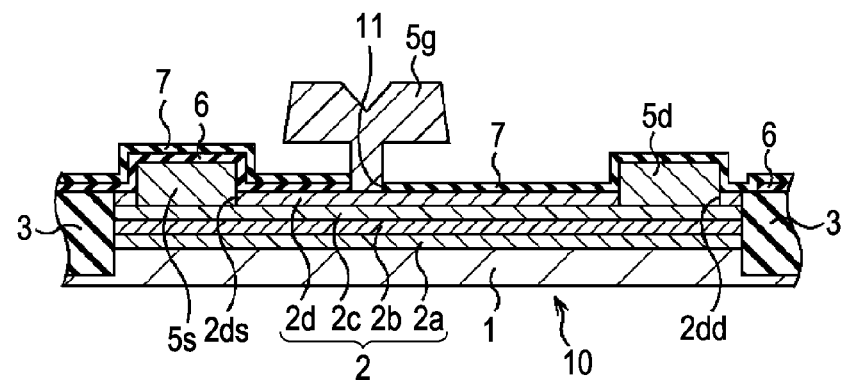

Then, as illustrated in FIG. 4E, similar to the first embodiment, the opening 11 is formed in the silicon nitride films 6 and 7 and further, the gate electrode 5g is formed. In the formation of the opening 11, the position of the opening 11 is decided so that, for example, the silicon nitride film 6 is positioned on the source electrode 5s side from the opening 11, that is, the silicon nitride film 6 preferably does not remain on the drain electrode 5d side from the opening 11.

Then, a protective film and wires are formed to complete the GaN type HEMT (semiconductor device). A device characteristic evaluation made by the inventors indicated that, similar to the first embodiment, a marked improvement effect of the current collapse was confirmed. Similarly, manufacturing problems such as resist opening cracks were also reduced.

An effect similar to that of the first embodiment may be achieved also by the second embodiment described above. The number of steps in the second embodiment may be made fewer than in the first embodiment.

Figure 5:
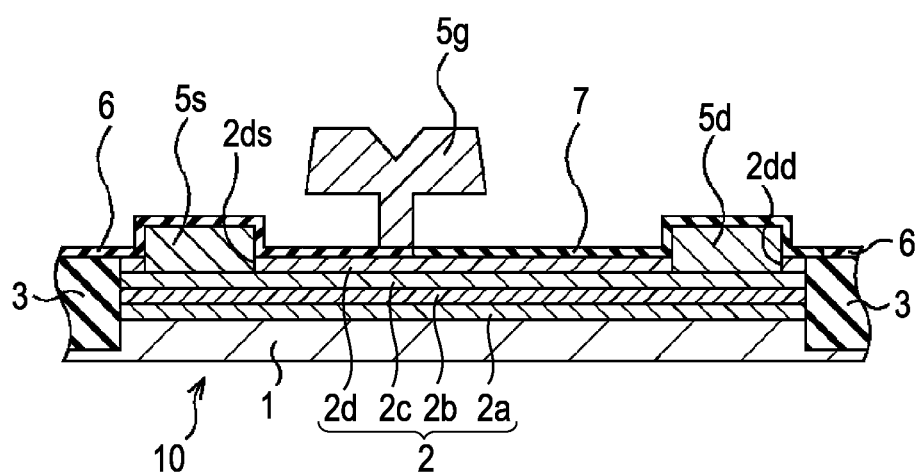
FIG. 5 is a sectional view illustrating a modification of the first embodiment.

The first and second embodiments concern relations between the gate electrode 5g and the compound semiconductor region 2 and use the Schottky structure, but as illustrated in FIG. 5, a metal-insulator semiconductor (MIS) structure may be adopted. In this case, the gate electrode 5g is preferably positioned over the silicon nitride film 6, instead of over the silicon nitride film 7. Electric fields are more likely to concentrate at edges of the gate electrode 5g and thus, it is preferable that the gate electrode 5g be positioned over the silicon nitride film 6 to realize a low gate leak current, which is an advantage of the MIS structure. While FIG. 5 illustrates a structure when the MIS structure is adopted in the first embodiment, a similar MIS structure is possible in the second embodiment.

A recess may be formed in a portion of the surface layer 2d below the gate electrode 5g.

Figure 6A:
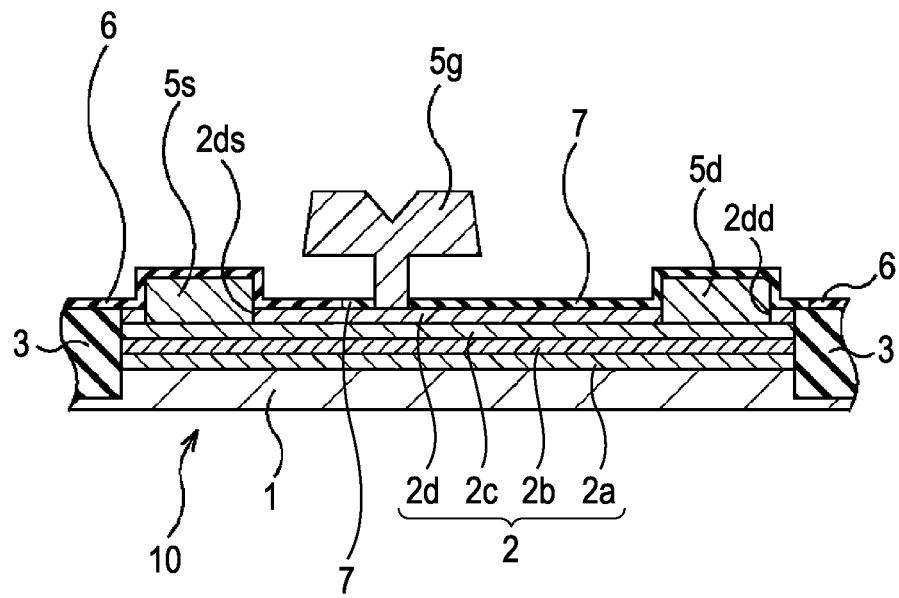
FIG. 6A is a sectional view illustrating another modification of the first embodiment.
Figure 6B:
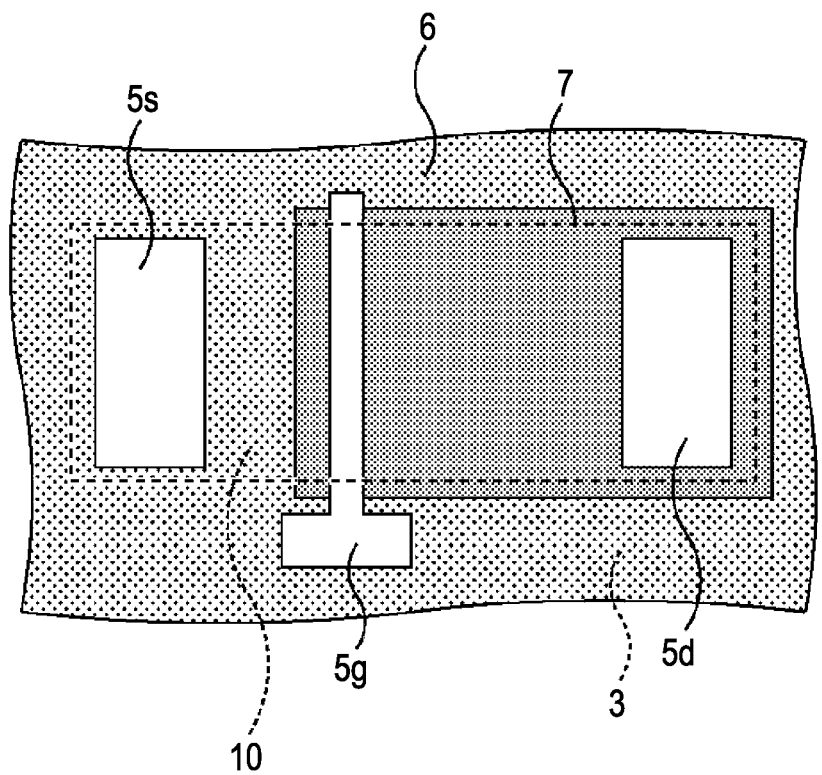
FIG. 6B is a diagram illustrating the layout of the modification illustrated in FIG. 6A.

As illustrated in FIGS. 6A and 6B, the gate electrode 5g may be positioned on the drain electrode 5d side of the boundary between the silicon nitride film 6 and the silicon nitride film 7. When compared with a case in which the opening 11 is formed to match the boundary between the silicon nitride film 6 and the silicon nitride film 7, a wide process margin may be secured. In this case, a part of the silicon nitride film 7 is positioned on the source electrode 5s side of the gate electrode 5g. The silicon nitride film 7 corresponds to a third protective film.

In either of the embodiments, instead of a silicon carbide (SiC) substrate, a GaN substrate, sapphire substrate, silicon substrate or the like may be used. Moreover, the substrate may not be semi-insulating.

Further, the gate electrode 5g need not be mushroom-shaped and may be formed in an overhanging shape over the surface layer 2d.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A compound semiconductor device comprising:
   a compound semiconductor laminated structure;
   a source electrode, a drain electrode, and a gate electrode formed over the compound semiconductor laminated structure;

a first protective film formed on the compound semiconductor laminated structure between the source electrode and the gate electrode and including silicon, at least a part of the first protective film directly contacts with the compound semiconductor laminated structure; and a second protective film formed on the compound semiconductor laminated structure between the drain electrode and the gate electrode and including more silicon than the first protective film, at least a part of the second protective film directly contacts with the compound semiconductor laminated structure, wherein the gate electrode is arranged at a position closer to the source electrode than the drain electrode.

2. The compound semiconductor device according to claim 1, wherein a ratio of silicon included in the first protective film is equal to or lower than the ratio of silicon in a stoichiometry and the ratio of silicon included in the second protective film is higher than the ratio of silicon in the stoichiometry.

3. The compound semiconductor device according to claim 1, wherein the first protective film and the second protective film are silicon nitride films.

4. The compound semiconductor device according to claim 1, wherein the second protective film includes $1.1 \times 10^{22}/cm^3$ Si—H bond groups or more.

5. The compound semiconductor device according to claim 1, wherein the first protective film includes less than $1.1 \times 10^{22}/cm^3$ Si—H bond groups.

6. The compound semiconductor device according to claim 1, wherein a refractive index of the first protective film is lower than a refractive index of the second protective film.

7. The compound semiconductor device according to claim 1, wherein the second protective film applies a higher compressive stress to the compound semiconductor laminated structure than the first protective film.

8. The compound semiconductor device according to claim 1, further comprising:

a portion of the second protective film is formed on the compound semiconductor laminated structure between the first protective film and the gate electrode.

9. The compound semiconductor device according to claim 1, wherein the gate electrode is connected to the compound semiconductor laminated structure through a Schottky junction.

10. The compound semiconductor device according to claim 1, wherein the gate electrode is formed over the compound semiconductor laminated structure via the first protective film.

11. A manufacturing method of a compound semiconductor device, comprising:

forming a source electrode, a drain electrode, and a gate electrode over a compound semiconductor laminated structure;

forming a first protective film including silicon on the compound semiconductor laminated structure between the source electrode and the gate electrode, at least a part of the first protective film directly contacts with the compound semiconductor laminated structure; and forming a second protective film including more silicon than the first protective film on the compound semiconductor laminated structure between the drain electrode and the gate electrode at least a part of the second protective film directly contacts with the compound semiconductor laminated structure, wherein the gate electrode is positioned closer to the source electrode than the drain electrode.

12. The manufacturing method of a compound semiconductor device according to claim 11, wherein a ratio of silicon included in the first protective film is equal to or lower than a ratio of silicon in a stoichiometry, and a ratio of silicon included in the second protective film is higher than the ratio of silicon in the stoichiometry.

13. The manufacturing method of a compound semiconductor device according to claim 11, wherein the first protective film and the second protective film are silicon nitride films.

14. The manufacturing method of a compound semiconductor device according to claim 11, wherein the second protective film includes $1.1 \times 10^{22}/cm^3$ Si—H bond groups or more.

15. The manufacturing method of a compound semiconductor device according to claim 11, wherein the first protective film includes less than $1.1 \times 10^{22}/cm^3$ Si—H bond groups.

16. The manufacturing method of a compound semiconductor device according to claim 11, wherein a refractive index of the first protective film is lower than a refractive index of the second protective film.

17. The manufacturing method of a compound semiconductor device according to claim 11, wherein the second protective film applies a higher compressive stress to the compound semiconductor laminated structure than the first protective film.

18. The manufacturing method of a compound semiconductor device according to claim 11, further comprising:

forming a portion of the second protective film, on the compound semiconductor laminated structure between the first protective film and the gate electrode.

* * * * *